(12) United States Patent
Chu et al.

(10) Patent No.: US 7,270,174 B2
(45) Date of Patent: Sep. 18, 2007

(54) METHOD, SYSTEM AND PROGRAM PRODUCT FOR AUTOMATICALLY CHECKING COOLANT LOOPS OF A COOLING SYSTEM FOR A COMPUTING ENVIRONMENT

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US); Randy J. Zoodsma, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 10/736,944

(22) Filed: Dec. 16, 2003

(65) Prior Publication Data

US 2005/0126747 A1    Jun. 16, 2005

(51) Int. Cl.
*G05D 23/00* (2006.01)
*G01M 3/04* (2006.01)

(52) U.S. Cl. .................. 165/11.1; 165/297; 73/40; 62/129

(58) Field of Classification Search ............... 165/11.1, 165/70, 238, 297; 73/40; 137/15.11; 374/5; 702/51; 62/129, 132, 338.1
See application file for complete search history.

(56) References Cited

U.S. PATENT DOCUMENTS 2,749,050 A * 6/1956 Booth ................... 165/297
2,829,869 A * 4/1958 Philipp ................. 62/238.1
3,498,061 A * 3/1970 Siegrist et al. ............ 60/327
3,939,383 A    2/1976 Alm ..................... 317/123
3,969,923 A    7/1976 Howell .................. 73/40.5 R (Continued)

FOREIGN PATENT DOCUMENTS

JP    7091711 A    4/1995

(Continued)

OTHER PUBLICATIONS

Chu et al., "Scalable Coolant Conditioning Unit with Integral Plate Heat Exchanger/Expansion Tank and Method of Use", Sep. 13, 2002, Pending U.S. Appl. No. 10/243,708, 29 pages.

(Continued)

*Primary Examiner*—Ljiljana Ciric
(74) *Attorney, Agent, or Firm*—Lily Neff, Esq.; Kevin P. Radigan, Esq.; Heslin Rothenberg Farley & Mesiti, P.C.

(57) ABSTRACT

Method, system and program product are provided for facilitating operation of a cooling system designed to provide system coolant to one or more electronics subsystems of a computing environment. The technique includes automatically checking at least one coolant loop of the cooling system for a leak. The automatically checking includes isolating the at least one coolant loop from coolant flow through the cooling system and checking for drop in coolant pressure within the at least one coolant loop. Upon detection of a drop in coolant pressure, isolation of the coolant loop is retained thereby allowing operation of the cooling system to continue notwithstanding detection of a leak in the at least one coolant loop.

10 Claims, 8 Drawing Sheets

U.S. PATENT DOCUMENTS

| | | | |
|---|---|---|---|
| 4,024,887 A | 5/1977 | McGregor | 137/386 |
| 4,531,405 A | 7/1985 | Leister | 73/290 |
| 4,702,412 A * | 10/1987 | Zelczer et al. | 165/238 |
| 4,738,304 A * | 4/1988 | Chalmers et al. | 165/11.1 |
| 5,283,552 A | 2/1994 | Sol | 340/605 |
| 5,557,965 A | 9/1996 | Fiechtner | 73/49.2 |
| 5,632,302 A | 5/1997 | Lenoir, Jr. | 137/312 |
| 5,698,117 A | 12/1997 | Doutt | 219/86.31 |
| 5,913,236 A | 6/1999 | Wodeslavsky | 73/40 |
| 6,205,798 B1 * | 3/2001 | Porter et al. | 62/129 |
| 6,401,525 B1 | 6/2002 | Jamieson | 73/40.5 R |
| 6,450,254 B1 * | 9/2002 | Hoyle et al. | 165/11.1 |
| 6,549,857 B2 * | 4/2003 | Fierro et al. | 702/51 |
| 6,629,450 B2 * | 10/2003 | Lu et al. | 73/40 |
| 6,720,882 B2 * | 4/2004 | Davey | 73/40 |
| 7,000,467 B2 * | 2/2006 | Chu et al. | 73/299 |
| 2002/0075648 A1 | 6/2002 | Nakagawa et al. | 361/690 |

FOREIGN PATENT DOCUMENTS

| | | |
|---|---|---|
| JP | 9178200 A | 7/1997 |
| JP | 11294851 A | 10/1999 |
| JP | 2000146672 A | 5/2000 |
| JP | 2001218682 A | 8/2001 |

OTHER PUBLICATIONS

Simons, Robert E., "The Evolution of IBM High Performance Cooling Technology", Dec. 1995, 7 pages, IEEE Transactions on Components, Packaging, and Manufacturing Technology—Part A, vol. 18, No. 4.

* cited by examiner fig. 1 fig. 2 fig. 3 fig. 4 fig. 5A fig. 5B fig. 6 fig. 7 fig. 8 fig. 9

METHOD, SYSTEM AND PROGRAM PRODUCT FOR AUTOMATICALLY CHECKING COOLANT LOOPS OF A COOLING SYSTEM FOR A COMPUTING ENVIRONMENT

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Method, System and Program Product for Monitoring Rate of Volume Change of Coolant Within A Cooling System," Chu et al, Ser. No. 10/736,947, filed Dec. 12, 2003, and issued as U.S. Pat. No. 7,000,467 on Feb. 21, 2006; and "Scalable Coolant Conditioning Unit with Integral Plate Head Exchanger/Expansion Tank and Method of Use," Chu et al., Ser. No. 10/243,708, filed Sep. 13, 2002, and issued as U.S. Pat. No. 6,714,412 on Mar. 30, 2004.

TECHNICAL FIELD

The present invention relates in general to cooling assemblies and other apparatus used for removing heat from electronic devices, modules and systems. More particularly, this invention relates to methods and systems for automatically checking for and isolating a coolant leak in a coolant loop of a cooling system designed, for example, to cool one or more electronics subsystems, such as electronics racks, of a computing environment.

BACKGROUND OF THE INVENTION

Heat flux dissipated by electronic equipment, such as microprocessors and power supplies, is again reaching levels that require cooling other than simple air cooling as a means of controlling component temperature. Liquid cooling (e.g., water cooling) is an attractive technology to manage these higher heat fluxes. The liquid absorbs the heat dissipated by the component/modules in an efficient manner, i.e., with minimal temperature rise from the liquid to the component being cooled. Typically, the heat is ultimately transferred from the liquid out into the outside environment. Otherwise, the liquid coolant would continuously rise in temperature.

From the 1970's through the early 1990's, International Business Machines Corporation accomplished this task by circulating cooling liquid via a coolant distribution unit which was a single, large computer room water conditioning unit (CRWCU). The CRWCU distributed conditioned chilled water to the various electronics racks of a mainframe computer system to be cooled. Conventionally, the electronics racks of the mainframe computer included memory frames, processor frames, input/output frames, power frames, etc. Operationally, the CRWCU received customer chilled water which was then used to remove heat from conditioned cooled water to the individual electronics racks of the computer room.

The CRWCU included a primary cooling loop wherein building chilled water was supplied and passed through a control valve driven by a motor. The valve determined an amount of building chilled water to be passed through a heat exchanger, with a portion of the building chilled water possibly being returned directly to the return via a bypass orifice. The CRWCU further included a second cooling loop with a reservoir tank from which water was pumped either by one of two pumps into the heat exchanger for conditioning and output therefrom as a conditioned water source to the electronics racks to be cooled within the computer room. The computer room water conditioning unit normally stood separate from the electronics frames, and again, would supply system water (typically maintained at about 22° C.) to all electronics frames of the computer room.

The coolant distribution unit, and more particularly, the computer room water conditioning unit (CRWCU), contained a single heat exchanger, a single reservoir, a single control valve, and redundant pumps. Thus, in the case of a failed pump, the CRWCU would automatically switch to the redundant pump, but any other malfunction in the coolant distribution unit would have brought down the whole computer room mainframe system. For example, if the heat exchanger, or control valve, or building chilled water source failed, the entire mainframe system in the computer room would also fail. Redundant mainframe computers would have been on the computer room floor to allow continuation of processing (in a degraded mode) until the downed mainframe could be repaired.

SUMMARY OF THE INVENTION

Today, a multi-frame mainframe system such as existed in the 1970's and 1980's has been replaced with single processor frames or racks. Thus, multiple processor frames, from high end, mid-range and low end could now be sourced from a single computer room water conditioning unit. Therein lies a problem, however. Any leak in any of the processor frames could cause all of the frames to lose conditioned water. A single leak could bring down the entire computer room floor.

With today's critical demand for high availability of electronics systems, it is desirable to have a technique for monitoring not just volume of coolant within the cooling system, but also the rate of volume change of coolant within the cooling system as a means of providing early detection and, thereafter, isolation of a leak within the system, i.e., before coolant within the system reaches a critically low level necessitating shutting down of the cooling system, as well as the associated electronics system.

Thus, the shortcomings of the prior art are overcome and additional advantages are provided through the provision of a method of facilitating operation of a cooling system for a computing environment. The method includes: automatically checking at least one coolant loop of the cooling system for a leak, the automatically checking including isolating the at least one coolant loop from coolant flow through the cooling system and checking for drop in coolant pressure within the at least one coolant loop; and upon detection of a drop in coolant pressure in the at least one coolant loop, retaining isolation of the at least one coolant loop from coolant flow through the cooling system.

In enhanced aspects, the at least one coolant loop comprises multiple coolant loops, and the isolating comprises successively isolating coolant loops of the multiple coolant loops to automatically check for a leak, and isolating each coolant loop of the multiple coolant loops having a leak detected therein. The automatically checking can further include for each coolant loop of the multiple loops: closing a first valve of the coolant loop; reading a first pressure value of coolant into the coolant loop; closing a second valve of the coolant loop; waiting a defined interval; reading a second pressure value of coolant in the coolant loop; and determining whether the difference in the first pressure value less the second pressure value is greater than a defined decay value, and if so, retaining isolation of the coolant loop from coolant flow through the cooling system.

Systems and computer program products corresponding to the above-summarized methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics subsystem" comprises any housing, frame, rack, compartment, etc., containing one or more heat generating components of a computer system or other electronics system requiring cooling. The term "electronics rack" includes any frame or rack having a heat generating component of a computer system or electronics system; and may be, for example, a stand alone computer processor having high, mid or low end processing capability. In one embodiment, an electronics rack may comprise multiple electronics drawers, each having one or more heat generating components requiring cooling.

One example of coolant within the coolant distribution unit is water. However, the concepts disclosed are readily adapted to use with other types of coolant on both the facility side and the system side. For example, the coolant may comprise a brine, a fluorocarbon liquid, or other similar chemical coolant or a refrigerant, while still maintaining the advantages and unique features of the present invention.

As noted briefly above, power levels in computer equipment (primarily processors) have again risen to a level where they no longer can be simply air cooled. The components will likely be water cooled. Heat dissipated by the processor can be transferred to the water via a water cooled cold plate. Water typically available at customer locations (i.e., data centers) is not suitable for use in these cold plates. First, condensation formation is a concern as the temperature of the data center water, ranging from 7° C. to 15° C., is far below the room dew point (typically 18-23° C.). Second, the relatively poor quality of the water (its chemistry, cleanliness, etc.) impacts system reliability. It is therefore desirable to utilize a water cooling/conditioning unit that circulates high quality water to/from the electronics to be cooled and rejects the heat to the data center water. As used herein, "facility water" or "facility coolant" refers to this data center water or coolant, while "system water" or "system coolant" refers to the cooled/conditioned water or coolant, respectively, circulating between the coolant distribution unit and the electronics subsystem(s) being cooled.

Figure 1:
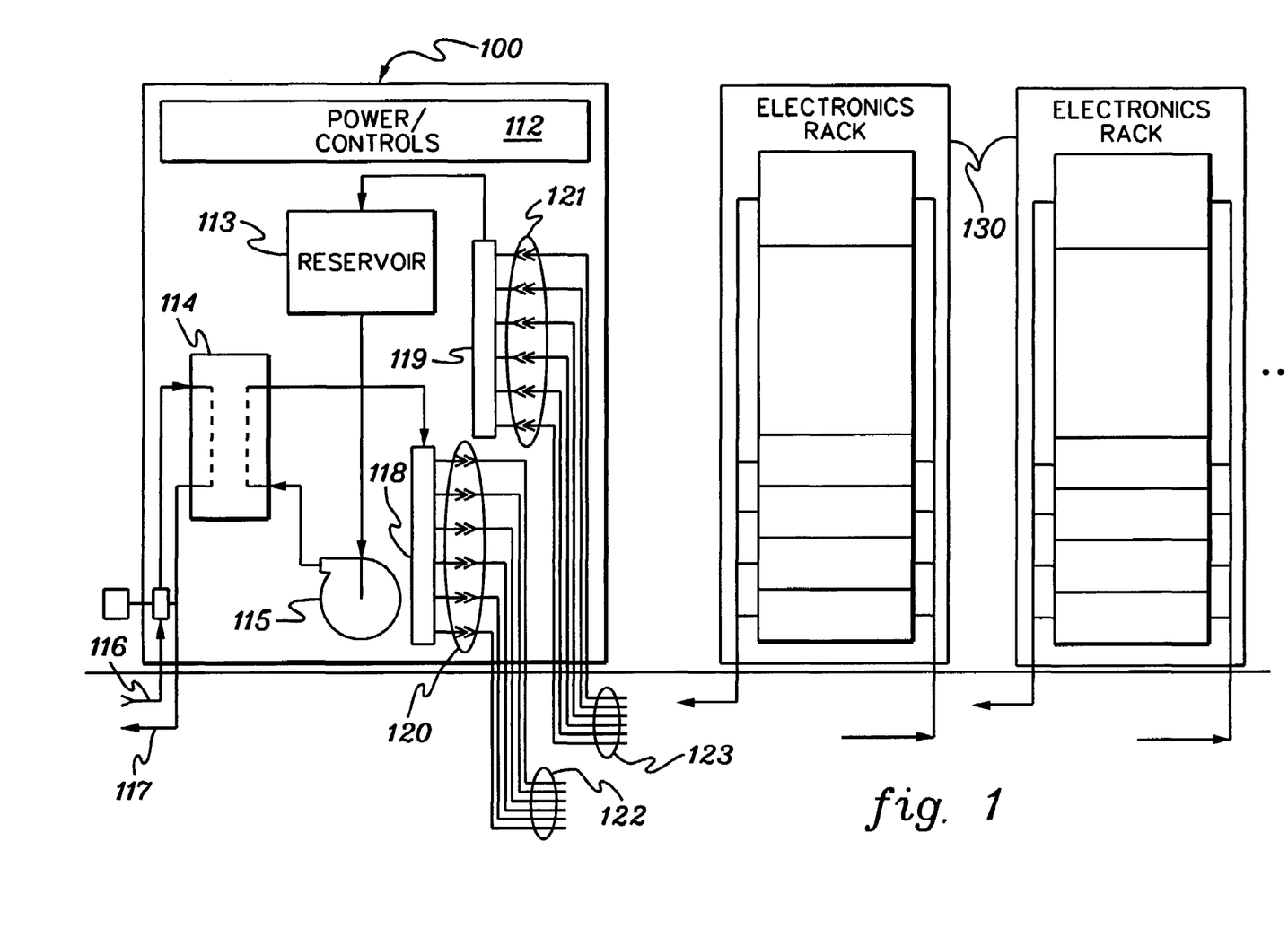
FIG. 1 depicts a conventional computer room water conditioning unit (CRWCU) for cooling electronics racks of a computing environment.

Reference is now made to the drawings, wherein the same reference numbers used throughout different figures designate the same or similar components. FIG. 1 depicts one embodiment of a conventional coolant distribution unit 100 for a computer room. The cooling unit was relatively large and occupied more than what would now be considered as two full electronics frames. Within the cooling unit was a power/control element 112, a reservoir/expansion tank 113, a heat exchanger 114, a pump 115 (often accompanied by a redundant second pump), customer water (or site or facility service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121.

Figure 2:
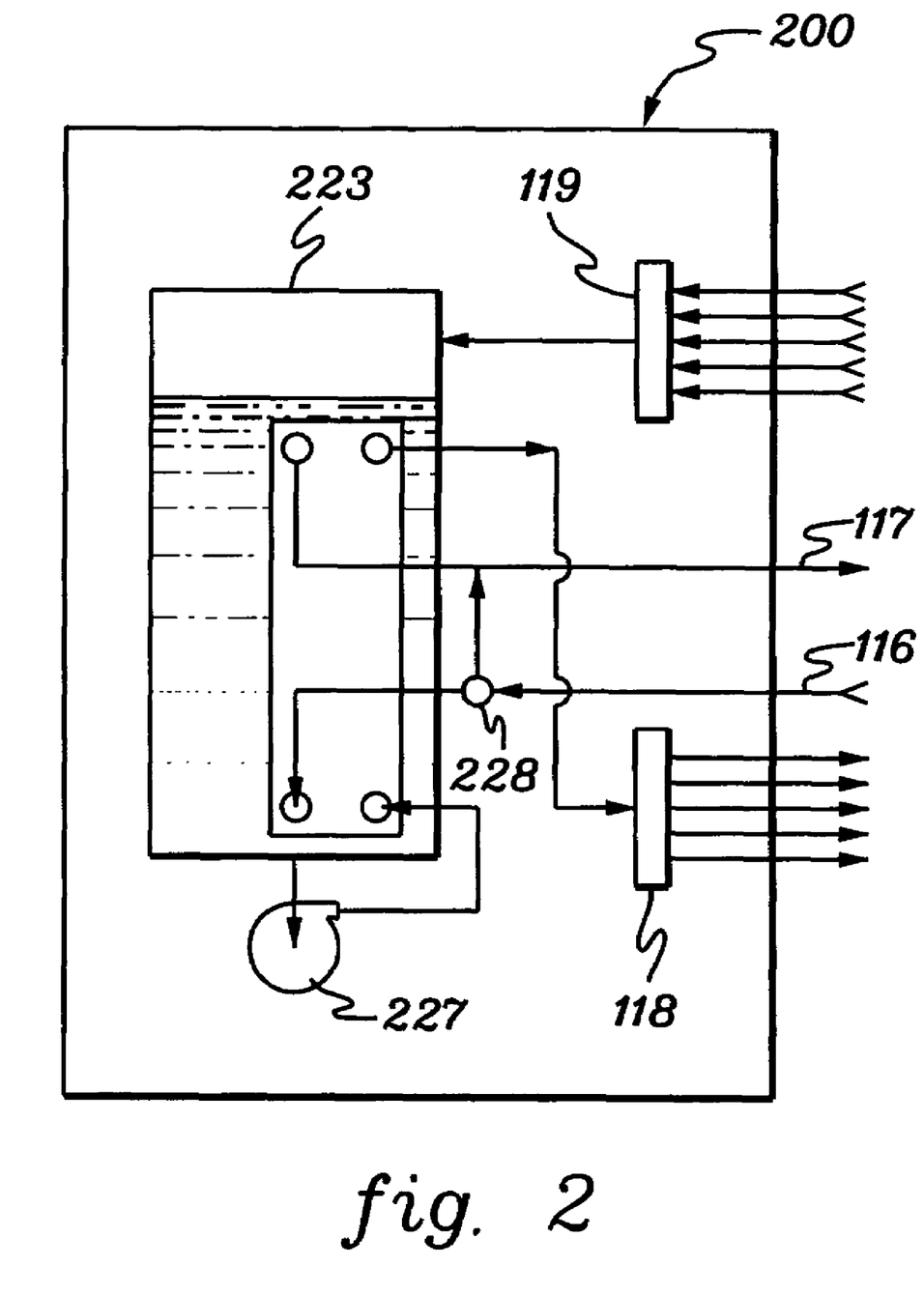
FIG. 2 is a schematic of one embodiment of a coolant distribution unit with an integrated heat exchanger/expansion tank, which can employ coolant monitoring, in accordance with an aspect of the present invention.

FIG. 2 illustrates one embodiment of a scalable coolant conditioning unit (SCCU) 200. Within unit 200 would be a power regulator and controller (not shown). System coolant returning from the electronics racks is collected in a return manifold 119 and directed through the expansion tank section of an integral heat exchanger/expansion tank 223, as described in detail in the above-incorporated U.S. patent application titled "Scalable Coolant Conditioning Unit with Integral Plate Heat Exchanger/Expansion Tank and Method of Use." From expansion tank 223, system coolant is directed to one or more pumping units 227. The higher pressure discharge of the pump(s) is directed to the "hot side" of the heat exchanger within the integral heat exchanger/expansion tank 223. The pump(s) can be connected to the manifolds via an insertion facilitation mechanism comprising automatic coupling assemblies (not shown), which are connected via flexible hoses to an isolation valve mechanism comprising a plurality of solenoid operated isolation valves. Alternatively, the isolation valves could be manually operated either locally or remotely, and the automatic coupling assemblies could be replaced by manually operated quick disconnects.

Having been cooled by the facility chilled water flowing through the "cold side" of the heat exchanger (116, 117), the system coolant is sent to the supply manifold 118 which distributes the coolant to the one or more electronics racks requiring cooling. Although not shown here, the SCCU could also incorporate means to filter the system water and automatically add a corrosion inhibitor such as benzotriazole (BTA) as needed. A two-way control valve 228 is used to regulate the flow rate of the facility chilled water to the heat exchanger within the integral heat exchanger/expansion tank 223, thereby controlling the temperature of system coolant delivered to the electronics racks. A thermistor temperature sensing element (not shown) can be located at the inlet of the system coolant supply manifold 118 to supply an electronic signal to the power/controller controlling operation of valve 228. If the system coolant temperature is higher than desired, valve 228 can be opened more allowing an increased flow of facility water through the heat exchanger resulting in a decrease of the temperature of the system water directed to the electronics racks from supply manifold 118. Alternatively, if the system water temperature is lower than desired, valve 228 can be closed more providing a decreased flow of facility water through the heat exchanger, resulting in an increase in the temperature of the system water directed to the electronics racks from supply manifold 118.

As noted initially above, any leak in a cooling system such as depicted in FIGS. 1 & 2, could cause all the frames of a computing environment to lose conditioned water. Thus, a single leak could bring down an entire computer room floor. For example, although improbable, such a leak could result if a break occurred in one of the coolant lines to or from the electronics subsystems. In many coolant distribution unit designs, such as depicted in FIGS. 1 & 2, a water level sensor was provided within the water reservoir or expansion tank to monitor the volume of liquid within the tank.

Figure 3:
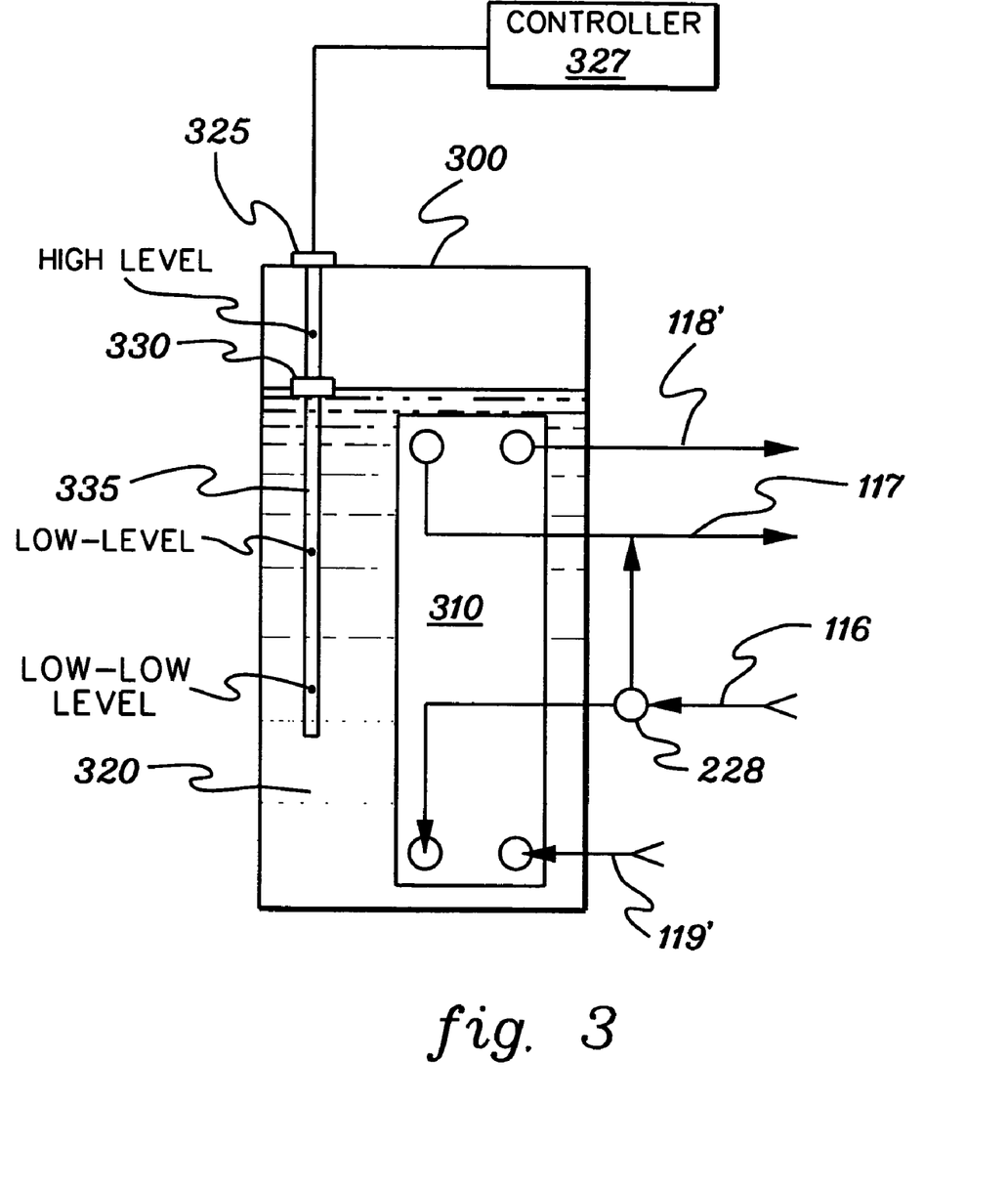
FIG. 3 depicts one embodiment of a system for monitoring coolant level within an expansion tank of a cooling system, wherein the expansion tank is shown with an integral heat exchanger therein.

FIG. 3 depicts one partial embodiment of a coolant distribution unit having an integrated heat exchanger/expansion tank 300. As shown, the integrated heat exchanger/expansion tank 300 includes a heat exchanger 310 disposed within an expansion tank having coolant 320, such as water, surrounding the heat exchanger. A water level sensor 325 is provided which includes a float 330 with embedded magnets and a tube 335 about which float 330 reciprocates with changes in the level of coolant within the expansion tank. Multiple reed switches, designated "high level", "low level" and "low-low level" in FIG. 3, are used to determine whether the water level in the expansion tank is at a high set point, low set point or at a low-low set point.

Operationally, the integrated heat exchanger/expansion tank 300 of FIG. 3 is employed similar to that of FIG. 2. Having been cooled by the facility chilled water flowing through the "cold side" of the heat exchanger (116, 117), the system coolant is sent 118' to the supply manifold which distributes the coolant to the one or more electronics racks requiring cooling. A two way or three way control valve 228 is used to regulate the flow rate of the facility chilled water to the heat exchanger 310 within the integral heat exchanger/expansion tank 300, thereby controlling the temperature of system coolant delivered to the electronics racks. System water returns 119' to the integrated heat exchanger/expansion tank via a return manifold, which collects system coolant from the electronics racks.

As the liquid level within the expansion tank varies, the water level sensor 325 sends a signal to a controller 327 when float 330 (with the magnets disposed therein) passes a reed switch at one of the high level, low level or low-low level. Note that the high level reed switch is provided to guard against a possible leak in the heat exchanger which could be discharging facility coolant directly into the expansion tank. Conversely, if there is a leak outside the expansion tank, water level within the tank will drop and the water level sensor will note the magnitude of the drop when the float passes the low level reed switch or reaches the low-low level reed switch.

If the water level drops to the low-low level, then the coolant pump(s) are shut down, and the associated electronics system is also powered down. With today's critical demand on high availability, this result is no longer tolerable, and a new mechanism is needed for sensing a leak in a cooling system before coolant in the expansion tank reaches a critically low level.

Figure 4:
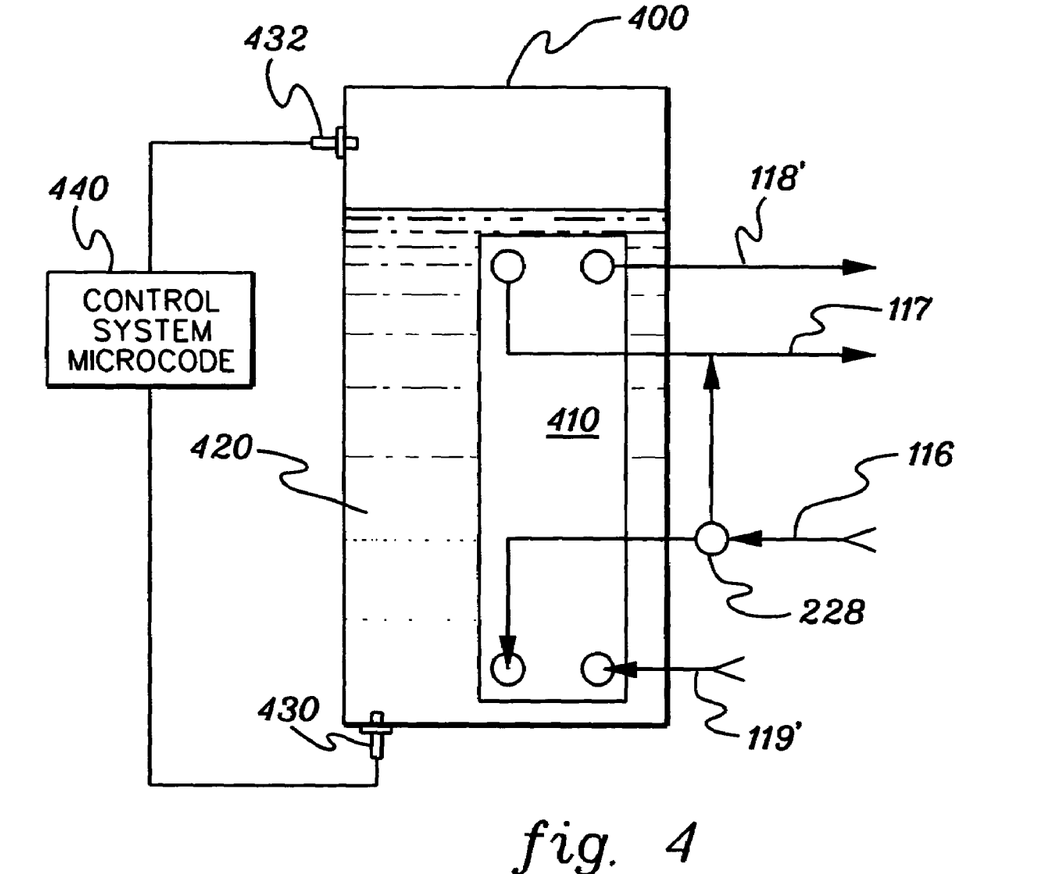
FIG. 4 depicts an alternate embodiment of a system for monitoring coolant volume and a rate of volume change of coolant within an integrated heat exchanger/expansion tank, in accordance with an aspect of the present invention.

FIG. 4 depicts one embodiment of an integrated heat exchanger/expansion tank 400 employing coolant monitoring in accordance with an aspect of the present invention. Note that FIG. 4 denotes one possible embodiment, wherein one pressure sensor 430 is coupled to a bottom portion of the tank and a second (optional) pressure sensor 432 is coupled to a top portion of the tank. Note, also, that integration of the heat exchanger 410 within the expansion tank is merely provided as one example. Alternatively, the expansion tank and heat exchanger could comprise separate components within the coolant distribution unit. Facility chilled water and system water flow to and from the heat exchanger would be similar to that described above in connection with FIGS. 2 & 3.

In this monitoring embodiment, the water (or more generally coolant) 420 level is determined using, for example, a hydrostatic pressure transducer mounted in the bottom of the expansion tank. The signal provided by this transducer is monitored and recorded at regular intervals by the control system microcode 440. The pressure at the bottom of the expansion tank is directly proportional to the head of water (i.e., level of water) within the tank. By taking successive pressure measurements and dividing by the time between measurements, it is possible to determine a rate of change of water volume in the tank. The control system microcode can be programmed to compare the rate of volume change against preset criteria to determine if a serious leak is present and initiate an appropriate action when needed. In addition, by sensing pressure at the bottom of the expansion tank, the control system microcode may also be used under more normal circumstances to determine if and when there is a need to add water to the tank to compensate for normal losses due to evaporation. In an enhanced embodiment, second sensor 432 is provided to allow for determination of a differential pressure measurement, which can then be used to determine a rate of volume change of coolant within the tank as explained further below in connection with FIG. 5A.

Figure 5A:
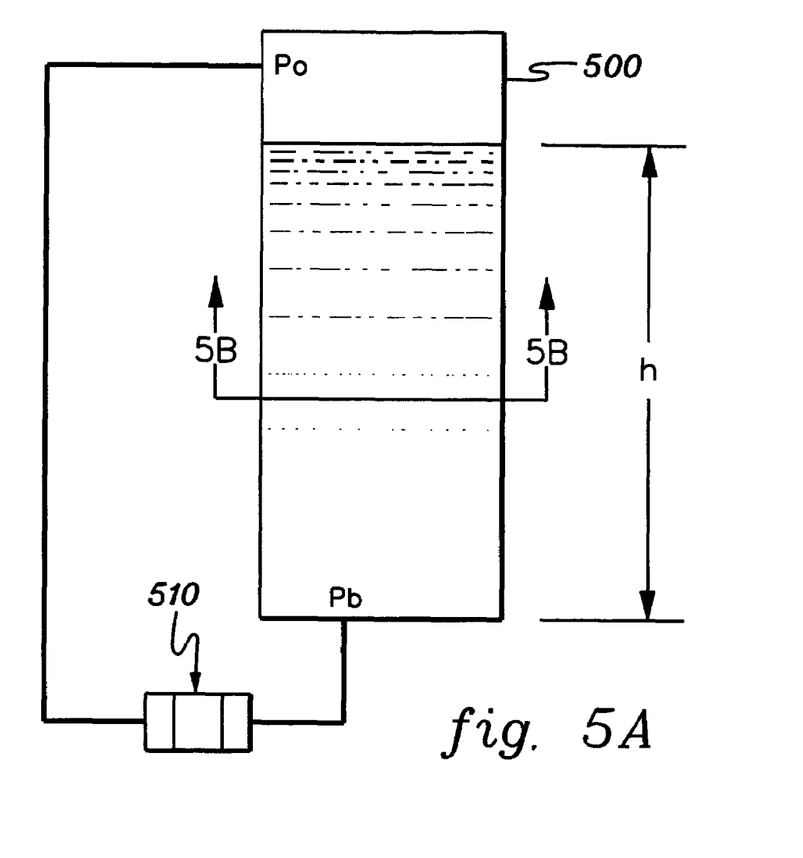
FIG. 5A depicts one embodiment of a cooling system expansion tank and differential pressure transducer for use in monitoring coolant volume and a rate of volume change of coolant within the expansion tank, in accordance with an aspect of the present invention.

FIG. 5A depicts an alternate embodiment of an expansion tank 500 of a coolant distribution unit to employ coolant monitoring in accordance with an aspect of the present invention. Pressure within the tank is measured in this example at two different locations, namely, pressure reading Pb (which is the pressure at the bottom of the tank) and pressure reading Po (which is the pressure at the top of the tank above the liquid level) are obtained. A single differential pressure transducer 510 can be employed as a sensor to directly measure the difference in pressure between Pb and Po. This difference can be expressed as equation 1:

$$\Delta P = Pb - Po = \rho g h \quad \text{(Eq. 1)}$$

wherein:
$\Delta P$=differential pressure, Pb–Po.
Pb=pressure at bottom of tank.
Po=pressure at top of tank (above liquid level).
$\rho$=liquid density.
g=gravity.
h=liquid height in tank.

Equation 1 can be solved for the height (h) of the liquid within the expansion tank and written as equation 2:

$$h = \frac{\Delta P}{\rho g} \quad \text{(Eq. 2)}$$

Once the height of the liquid within the expansion tank is known, the volume of liquid within the tank can be determined by equation 3:

$$V = Ah \quad \text{(Eq. 3)}$$

wherein:
V=Volume of liquid in tank.
A=tank cross-sectional area.
h=liquid height in tank.

Figure 5B:
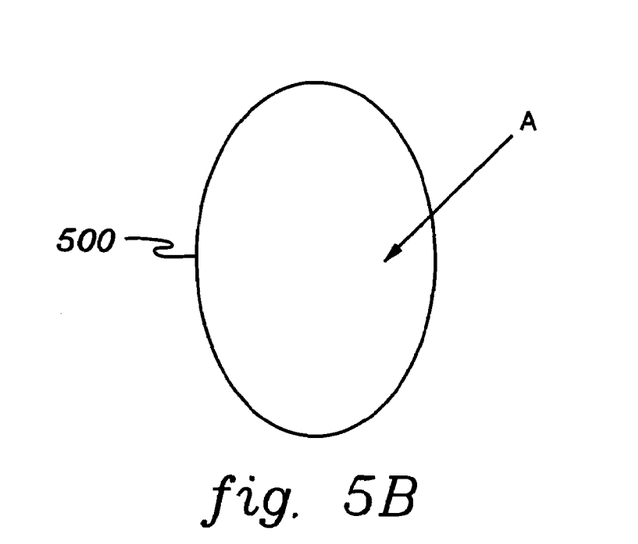
FIG. 5B depicts a cross-sectional view of the expansion tank of FIG. 5A, taken along line 5B-5B.

Note that this example assumes a uniform cross-sectional area for the expansion tank, as shown in FIGS. 5A & 5B. However, those of ordinary skill in the art can readily provide the necessary equations in order to determine liquid volume for a given expansion tank configuration.

By taking successive differential pressure measurements and converting the pressure measurements into change in volume, it is possible to determine a rate of volume change of liquid within the tank (or leak rate from the expansion tank), as expressed in equation 4:

$$\frac{\Delta V}{\Delta t} = \text{rate of change of tank volume} = \text{leak rate} \quad \text{(Eq. 4)}$$

Wherein:
$\Delta t$=time interval.

Figure 6:
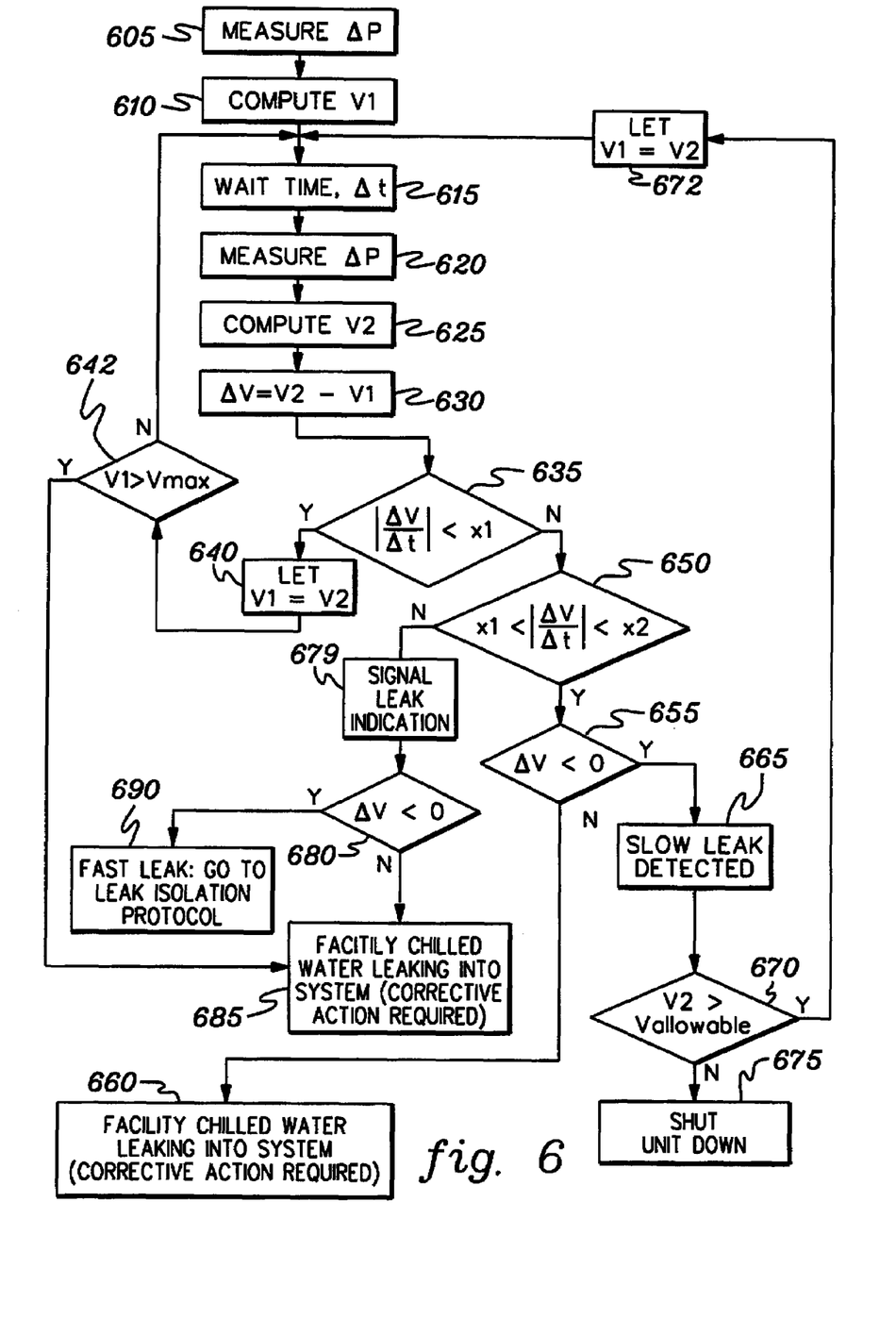
FIG. 6 depicts one embodiment of a flowchart for monitoring coolant volume and a rate of volume change of coolant within a cooling system and for determining whether action is to be currently taken based thereon, in accordance with an aspect of the present invention.

FIG. 6 is one flowchart example of processing implemented by the control system microcode in accordance with an aspect of the present invention. This processing begins with measuring of the differential pressure 605 at time t1, using for example, equation 1. Once obtained, the volume of liquid within the expansion tank at time t1 is determined 610. After waiting a known interval of time ($\Delta t$) 615, the differential pressure is again measured 620 at time t2 and a volume of liquid in the expansion tank at time t2 is computed 625. The change in volume between time t1 and time t2 is then determined by subtracting the computed volume v1 at time t1 from the volume v2 at time t2 630. A condition statement 635 determines whether the magnitude of the change in volume ($\Delta V$) divided by the known time interval ($\Delta t$) between measurements is less than a first threshold value or first leak rate set point x1. This statement seeks to determine whether the rate of volume change of coolant within the expansion tank is within normal operating parameters.

If the magnitude is less than the first threshold value x1, then the measured volume at time t2 is reassigned to comprise the measured volume at time t1 640 and determination is made whether volume V1 is greater than a defined maximum volume Vmax 642. If "yes", facility chilled water is leaking into the system and corrective action is required 685. Otherwise, the process repeats with a waiting of the known time interval 615 before making the next differential pressure measurement. Assuming that the condition statement 635 is not satisfied, then processing determines whether the rate of volume change of coolant within the expansion tank is between the first threshold and a second threshold value or second leak rate set point x2 650. If "yes", then a slow leak has been identified and processing determines whether the change in volume between measured time t1 and time t2 is less than zero, i.e., is volume V1 larger than volume V2. If "no", then facility chilled water is leaking into the expansion tank and corrective action is required 660. If "yes", then a slow leak is detected 665 (and notice thereof can be provided to an operator of the computing environment), and processing determines whether the volume of coolant within the expansion tank at time t2 is greater than a minimum allowable volume Vallowable 670. If the volume has dropped below the minimum allowable level, then the coolant distribution unit is shut down 675, otherwise monitoring continues by reassigning the measured volume at time t2 to comprise the measured volume at time t1 672, and waiting for the next time interval to pass 615 before repeating the measurements.

From condition statement 650, if the rate of volume change of coolant within the expansion tank is greater than the second threshold value x2, then a fast leak has been identified and is signaled 679, and processing determines whether the change in volume is less than zero 680, i.e., is the volume measurement at time t1 larger than the volume measurement at time t2. If so, then leak isolation protocol such as described below in connection with FIGS. 7-9 can be automatically initiated 690. Otherwise, facility chilled water is leaking into the system and corrective action is required 685. If so, then leak isolation protocol can be automatically initiated 690, for example, as described in the above-incorporated, co-filed patent application. Otherwise, facility chilled water is leaking into the system and corrective action is required 685.

Figure 7:
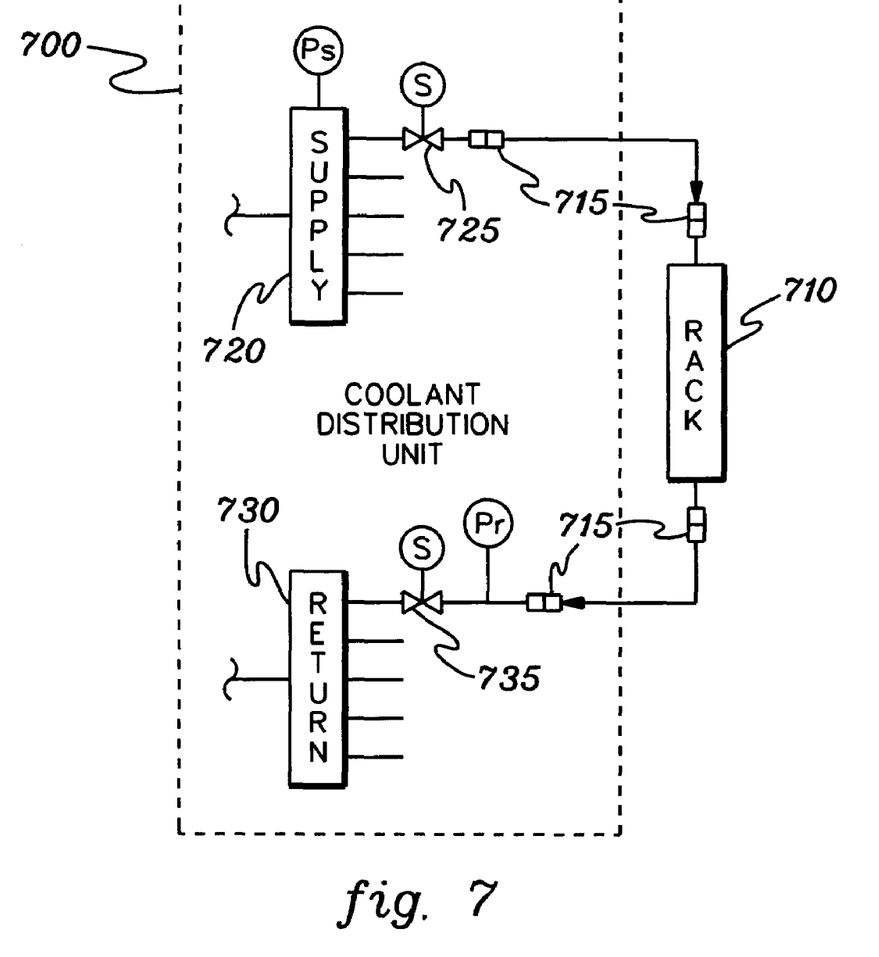
FIG. 7 depicts a simplified embodiment of a portion of a coolant distribution unit showing a coolant loop which supplies coolant to an electronics rack of a computing environment, in accordance with an aspect of the present invention.
Figure 8:
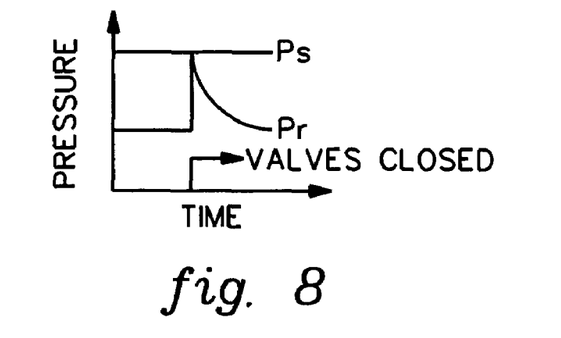
FIG. 8 is a graph of coolant pressure versus time for a leaking coolant loop of a coolant system employing an automatic checking and leak isolation protocol, in accordance with an aspect of the present invention.

One embodiment of an automatic leak isolation protocol is described below with reference to FIGS. 7-9. This protocol assumes the existence of a coolant distribution unit, generally denoted 700 in FIG. 7, which includes multiple coolant loops, one of which is depicted in FIG. 7 as supplying coolant to an electronics rack 710. Electronics rack 710 couples to the coolant distribution unit 700 through multiple connect/disconnect couplings 715. Although shown as having five coolant loop supply lines out of a supply manifold 720, the number of coolant loops could equal, for example, the number of electronics racks in the computing environment.

In accordance with one embodiment of the leak isolation protocol described herein, a technique is provided for identifying a coolant loop having a leak and then isolating that coolant loop to minimize loss of coolant, thereby allowing the remaining electronics racks to continue operating normally. As shown in FIG. 7, a pressure transducer "Ps" is mounted on the supply manifold 720, and solenoid actuated valves 725, 735 on the supply and return, respectively, are provided for each coolant loop. A pressure transducer "Pr" is also disposed at the return for each coolant loop.

Operationally, one method and sequence of operation for the leak isolation protocol would be described as follows:

1. Hydrostatic pressure within the expansion tank (see FIG. 5A) of the coolant distribution unit is monitored and logged by control system microcode (see FIG. 4). This data is used by the microcode to calculate a rate of volume change of coolant within the expansion tank as described above.
2. If the rate of volume change of coolant indicates the presence of a leak in the cooling system, then the leak isolation protocol is initiated by the microcode to identify and isolate any leaking coolant loop of the system.
3. Under microcode control, the solenoid operated shut-off valves at the return and supply manifolds at a first coolant loop are energized and closed in that order.
4. The return pressure "Pr" is monitored for a short time (e.g., 5-10 seconds). If a leak is present, the return pressure will decay below supply pressure "Ps" as shown in FIG. 8. Responsive to this decay, the microcode initiates a power down sequence for the effected electronics rack. Note that pressure within a leaking coolant loop will decay rapidly even for relatively small leak rates.
5. If a leak is not present in the coolant loop, then the return pressure "Pr" will hold steady at a level equal to the supply pressure "Ps", and the microcode will energize and open the solenoid valves 725, 735 for the coolant loop returning normal coolant flow through the loop.
6. The above test sequence 3.-5. is repeated for each successive coolant loop in the system to identify and isolate any leaking coolant loop. Once identified, the solenoid valves in a leaking coolant loop are left closed to isolate the coolant loop, and a signal is sent to power down the effected electronics rack.

A similar sequence and procedure to that discussed above may be executed during normal operation at prescribed time intervals to test and ensure that the leak detection and isolation system is operative.

Figure 9:
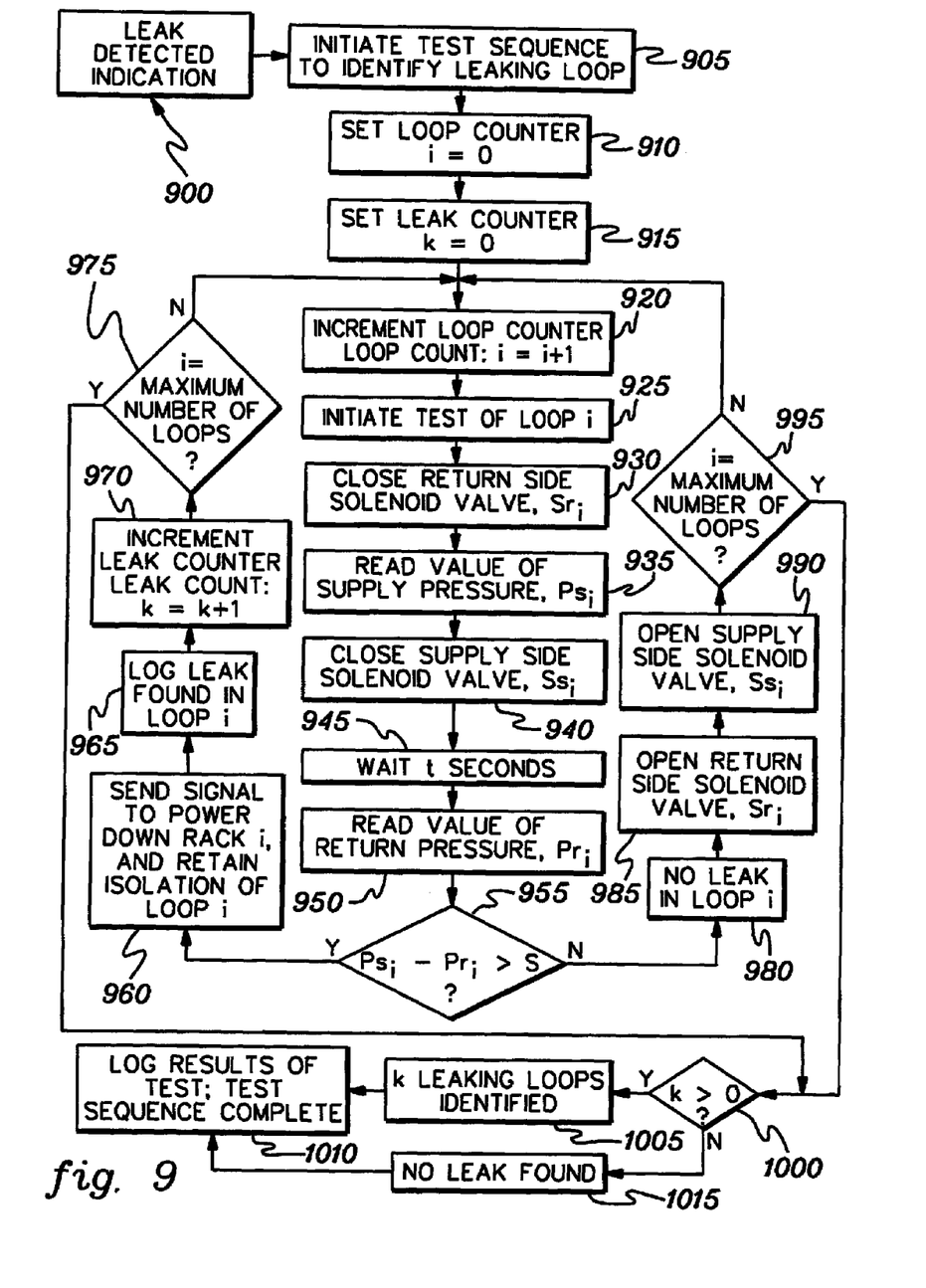
FIG. 9 depicts one embodiment of a flowchart for facilitating operation of a cooling system by automatically (and successively) checking coolant loops of the cooling system for a leak, in accordance with an aspect of the present invention.

FIG. 9 is one flowchart example of a leak identification and isolation protocol which can be implemented by control system microcode in accordance with an aspect of the present invention. This protocol is responsive to a leak detected indication, which may result from processing such as depicted in FIG. 6. Upon receipt of a leak detected indication 900, the test sequence is initiated to identify a leaking coolant loop 905. This includes initially setting a loop counter i equal to zero 910, and setting a leak counter k equal to zero 915. The loop counter i is then incremented 920, and testing of coolant loop i is initiated 925. This includes closing the return side solenoid valve $Sr_i$ 930 and reading a value of supply pressure $Ps_i$ 935. This is followed by closing the supply side solenoid valve $Ss_i$ 940, and waiting an interval of time t second 945, after which the value of the return pressure is read $Pr_i$ 950.

Processing then determines whether the value of the supply side pressure $Ps_i$ less the value of the return side pressure $Pr_i$ for this coolant loop is greater than a defined decay value "S" 955. If "yes", then processing retains isolation of loop i and sends a signal to power down the associated electronics rack i which is cooled by the leaking coolant loop i 960. The found leak for coolant loop i is logged 965 and the leak counter is incremented by one to signal the identification of one leaking coolant loop 970. Processing then determines whether all coolant loops have been tested 975. If "no", then the process repeats for the next coolant loop of the system by incrementing the loop counter by one 920.

If the pressure difference between the supply pressure $Ps_i$ and the return pressure $Pr_i$ is less than the defined decay value S, then no leak in coolant loop i is identified 980 and the return side solenoid valve is opened $Pr_i$ 985, which is followed by opening of the supply side solenoid valve $Ss_i$ 990. Processing then determines whether all coolant loops have been evaluated 995, and if "no" increments the loop counter to evaluate the next coolant loop.

Once all coolant loops have been tested, processing determines whether the value of the leak counter is greater than zero 1000. If "no", no leaks have been identified 1015 and the results of the testing are logged, which completes the test sequence 1010. This may result if there was, for example, an erroneous initial indication of a leak, or possibly that a leak exists somewhere else in the coolant system rather than the coolant loops. If the leak counter is greater than zero, then k leaking loops have been identified 1005. The results are again logged and the test sequence is completed 1010. Note that in the case of identified leaking loops, isolation of the coolant loop at issue is retained by maintaining closure of the supply side and return side solenoid valves for that loop.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of facilitating operation of a cooling system for a computing environment, the method comprising:
   automatically checking at least one coolant loop of the cooling system for a leak, the automatic checking including isolating the at least one coolant loop from coolant flow through the cooling system and checking for drop in coolant pressure within the at least one coolant loop;
   upon detection of a drop in coolant pressure in the at least one coolant loop, retaining isolation of the at least one coolant loop from coolant flow through the cooling system, the automatic checking further comprising for each coolant loop of the at least one coolant loop of the cooling system:

Closing a first valve of the coolant loop while keeping a second valve of the coolant loop open;

Reading a first pressure value of the coolant in the coolant loop while the first valve is closed and the second valve is open;

Closing the second valve of the coolant loop;

Waiting a defined interval after closing the second valve of the coolant loop;

Reading a second pressure value of the coolant in the coolant loop while both the first pressure valve and the second pressure valve are closed; and, Determining whether the difference of the first pressure value less the second pressure value is greater than a defined decay value, and if so, retaining isolation of the coolant loop from coolant flow through the cooling system.

2. The method of claim 1, wherein the at least one coolant loop comprises multiple coolant loops, and wherein the isolating comprises successively isolating coolant loops of the multiple coolant loops to automatically check for a leak, and isolating each coolant loop of the multiple coolant loops having a leak detected therein.

3. The method of claim 1, wherein the first valve comprises a return side valve, the first pressure value comprises a supply pressure of coolant into the cooling loop, the second valve comprises a supply side valve, and the second pressure value comprises coolant pressure at the return side of the coolant loop.

4. The method of claim 1, wherein each coolant loop of the at least one coolant loop cools a different associated electronics subsystem of the computing environment, and wherein the method further comprises sending a signal to shutoff power to the associated electronics subsystem when a leaking coolant loop is detected.

5. The method of claim 1, wherein the automatic checking is responsive to an indication of a coolant leak, and wherein the checking comprises comparing a change in pressure within the coolant loop over an interval of time with a defined decay value, and if greater than the defined decay value, then recording presence of a leak in the at least one coolant loop and retaining isolation of the at least one coolant loop from coolant flow through the cooling system.

6. The method of claim 1, wherein the at least one coolant loop comprises multiple coolant loops, and wherein the automatic checking comprises automatically checking for a leak in each coolant loop of the multiple coolant loops and logging, for each coolant loop, a result of the automatic checking.

7. The method of claim 1, further comprising initiating the automatically checking responsive to an indication of a coolant leak, the indication of a coolant leak resulting from employing at least one pressure transducer to obtain multiple pressure measurements related to an amount of coolant within an expansion tank of the cooling system, wherein the indication of a leak is signaled when a rate of volume change of coolant within the expansion tank is above a leak rate set point.

8. At least one program storage device readable by a machine, tangibly embodying at least one program of instructions executable by the machine for implementing a method of facilitating operation of a cooling system for a computing environment, the method comprising:

automatically checking at least one coolant loop of the cooling system for a leak, the automatic checking including isolating the at least one coolant loop from coolant flow through the cooling system and checking for drop in coolant pressure within the at least one coolant loop; and upon detection of a drop in coolant pressure in the at least one coolant loop, retaining isolation of the at least one coolant loop from coolant flow through the cooling system, the automatic further comprising for each coolant loop of the at least one coolant loop of the cooling system:

Closing a first valve of the coolant loop while keeping a second valve of the coolant loop open;

Reading a first pressure value of the coolant in the coolant loop while the first valve is closed and the second valve is open;

Closing the second valve of the coolant loop;

Waiting a defined interval after closing the second valve of the coolant loop;

Reading a second pressure value of the coolant in the coolant loop while both the first pressure valve and the second pressure valve are closed; and, Determining whether the difference of the first pressure value less the second pressure value is greater than a defined decay value, and if so, retaining isolation of the coolant loop from coolant flow through the cooling system.

9. The at least one program storage device of claim 8, wherein the at least one coolant loop comprises multiple coolant loops, and wherein the isolating comprises successively isolating coolant loops of the multiple coolant loops to automatically check for a leak, and isolating each coolant loop of the multiple coolant loops having a leak detected therein.

10. The at least one program storage device of claim 8, wherein the first valve comprises a return side valve, the first pressure value comprises a supply pressure of coolant into the cooling loop, the second valve comprises a supply side valve, and the second pressure value comprises coolant pressure at the return side of the coolant loop.

* * * * *